(12) United States Patent
Mandai et al.

(10) Patent No.: US 9,997,551 B2
(45) Date of Patent: Jun. 12, 2018

(54) SPAD ARRAY WITH PIXEL-LEVEL BIAS CONTROL

(71) Applicant: Apple Inc., Cupertino, CA (US)

(72) Inventors: Shingo Mandai, Mountain View, CA (US); Gennadiy A. Agranov, San Jose, CA (US); Matthew C. Waldon, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 180 days.

(21) Appl. No.: 14/975,790

(22) Filed: Dec. 20, 2015

(65) Prior Publication Data

US 2017/0179173 A1    Jun. 22, 2017

(51) Int. Cl.
| | |
|---|---|
| *H01L 27/14* | (2006.01) |
| *H01L 27/146* | (2006.01) |
| *H01L 31/107* | (2006.01) |
| *G01S 17/89* | (2006.01) |
| *G01S 7/486* | (2006.01) |
| *G01S 7/497* | (2006.01) |

(52) U.S. Cl.
CPC ...... *H01L 27/14609* (2013.01); *G01S 7/4863* (2013.01); *G01S 7/497* (2013.01); *G01S 17/89* (2013.01); *H01L 27/14641* (2013.01); *H01L 27/14643* (2013.01); *H01L 31/107* (2013.01)

(58) Field of Classification Search
CPC ............ H01L 27/14609; H01L 31/107; H01L 27/14641; H01L 27/14643; G01S 7/497; G01S 7/4863; G01S 17/89
See application file for complete search history.

(56) References Cited

U.S. PATENT DOCUMENTS

| | | |
|---|---|---|
| 7,126,218 B1 | 10/2006 | Darveaux et al. |
| 7,303,005 B2 | 12/2007 | Reis et al. |
| 7,800,067 B1 | 9/2010 | Rajavel et al. |
| 8,193,482 B2 | 6/2012 | Itsler |

(Continued)

FOREIGN PATENT DOCUMENTS

| | | |
|---|---|---|
| CN | 103763485 A | 4/2014 |
| DE | 202013101039 U1 | 3/2014 |

(Continued)

OTHER PUBLICATIONS

Webster et al., "A silicon photomultiplier with >30% detection efficiency from 450-750nm and 11.6μm pitch NMOS-only pixel with 21.6% fill factor in 130nm CMOS", Proceedings of the European Solid-State Device Research Conference (ESSDERC), pp. 238-241, Sep. 7-21, 2012.

(Continued)

*Primary Examiner* — Tony Ko
(74) *Attorney, Agent, or Firm* — D. Kligler IP Services Ltd.

(57) ABSTRACT

A sensing device includes an array of sensing elements. Each sensing element includes a photodiode, including a p-n junction, and a local biasing circuit, coupled to reverse-bias the p-n junction at a bias voltage greater than a breakdown voltage of the p-n junction by a margin sufficient so that a single photon incident on the p-n junction triggers an avalanche pulse output from the sensing element. A bias control circuit is coupled to set the bias voltage in different ones of the sensing elements to different, respective values that are greater than the breakdown voltage.

18 Claims, 3 Drawing Sheets

(56) References Cited

U.S. PATENT DOCUMENTS

| | | |
|---|---|---|
| 8,259,293 B2 | 9/2012 | Andreou |
| 8,275,270 B2 | 9/2012 | Shushakov et al. |
| 8,355,117 B2 | 1/2013 | Niclass |
| 8,405,020 B2 | 3/2013 | Menge |
| 8,766,164 B2 | 7/2014 | Sanfilippo et al. |
| 8,963,069 B2 | 2/2015 | Drader et al. |
| 9,024,246 B2 | 5/2015 | Jiang et al. |
| 9,052,356 B2 | 6/2015 | Chu et al. |
| 9,076,707 B2 | 7/2015 | Harmon |
| 9,016,849 B2 | 8/2015 | Duggal et al. |
| 2001/0020673 A1 | 9/2001 | Zappa et al. |
| 2002/0070443 A1 | 6/2002 | Mu et al. |
| 2007/0262441 A1 | 11/2007 | Chen |
| 2010/0019128 A1 | 1/2010 | Itzler |
| 2012/0075615 A1 | 3/2012 | Niclass et al. |
| 2012/0132636 A1 | 5/2012 | Moore |
| 2013/0015331 A1 | 1/2013 | Birk et al. |
| 2013/0092846 A1 | 4/2013 | Henning et al. |
| 2013/0208258 A1 | 8/2013 | Eisele et al. |
| 2013/0300838 A1 | 11/2013 | Borowski |
| 2013/0342835 A1 | 12/2013 | Blacksberg |
| 2014/0191115 A1 | 7/2014 | Webster et al. |
| 2014/0231630 A1 | 8/2014 | Rae et al. |
| 2014/0321862 A1 | 10/2014 | Frohlich et al. |
| 2014/0353471 A1 | 12/2014 | Raynor et al. |
| 2015/0041625 A1 | 2/2015 | Dutton et al. |
| 2015/0163429 A1 | 6/2015 | Dai et al. |
| 2015/0200222 A1 | 7/2015 | Webster |
| 2015/0200314 A1 | 7/2015 | Webster |
| 2015/0285625 A1* | 10/2015 | Deane ............... G01S 17/10 348/140 |

FOREIGN PATENT DOCUMENTS

| | | |
|---|---|---|
| EP | 2157445 A2 | 2/2010 |
| EP | 2477043 A1 | 7/2012 |
| WO | 2010149593 A1 | 12/2010 |

OTHER PUBLICATIONS

Kota et al., "System Design and Performance Characterization of a MEMS-Based Laser Scanning Time-of-Flight Sensor Based on a 256 × 64-pixel Single-Photon Imager", IEEE Photonics Journal, vol. 5, issue 2, 15 pages ,Apr. 2013.

Niclass et al., "Design and characterization of a 256×64-pixel single-photon imager in CMOS for a MEMS-based laser scanning time-of-flight sensor", Optics Express, vol. 20, issue 11, pp. 11863-11881, May 21, 2012.

European Application # 16201123.3 Search Report dated Mar. 6, 2017.

Application # PCT/US2016/65472 International Search Report dated Mar. 2, 2017.

Charbon et al., "SPAD-Based Sensors", TOF Range-Imaging Cameras, Springer-Verlag, pp. 11-38, year 2013.

Sharma et al., U.S. Appl. No. 14/830,760, filed Aug. 20, 2015.

Walker et al., "A 128×96 pixel event-driven phase-domain ΔΣ-based fully digital 3D camera in 0.13μm CMOS imaging technology", IEEE International Solid-State Circuits Conference—(ISSCC), Session 23, Image Sensors, 23.6, pp. 410-412, Feb. 23, 2011.

Niclass et al., "A 0.18 um CMOS SoC for a 100m range, 10 fps 200×96 pixel Time of Flight depth sensor", IEEE International Solid-State Circuits Conference—(ISSCC), Session 27, Image Sensors, 27.6, pp. 488-490, Feb. 20, 2013.

TW application # 105139124 office action dated Sep. 21, 2017.

CN application # 201621393179.2 office action dated Sep. 29, 2017.

International Application # PCT/US2017/039171 search report dated Oct. 26, 2017.

Buttgen et al., "Pseudonoise Optical Modulation for Real-Time 3-D Imaging With Minimum Interference", IEEE Transactions on Circuits and Systems I: Regular Papers, vol. 54, Issue 10, pp. 2109-2119, Oct. 1, 2007.

U.S. Appl. No. 14/830,760 office action dated Sep. 8, 2017.

U.S. Appl. No. 14/830,760 office action dated Feb. 22, 2018.

* cited by examiner

US 9,997,551 B2

SPAD ARRAY WITH PIXEL-LEVEL BIAS CONTROL

FIELD OF THE INVENTION

The present invention relates generally to optoelectronic devices, and particularly to high-sensitivity detector arrays.

BACKGROUND

Single-photon avalanche diodes (SPADs), also known as Geiger-mode avalanche photodiodes (GAPDs), are detectors capable of capturing individual photons with very high time-of-arrival resolution, of the order of a few tens of picoseconds. They may be fabricated in dedicated semiconductor processes or in standard CMOS technologies. Arrays of SPAD sensors, fabricated on a single chip, have been used experimentally in 3D imaging cameras. Charbon et al. provide a useful review of SPAD technologies in "SPAD-Based Sensors," published in *TOF Range-Imaging Cameras* (Springer-Verlag, 2013), which is incorporated herein by reference.

In a SPAD, a p-n junction is reverse-biased at a level well above the breakdown voltage of the junction. At this bias, the electric field is so high that a single charge carrier injected into the depletion layer, due to an incident photon, can trigger a self-sustaining avalanche. The leading edge of the avalanche current pulse marks the arrival time of the detected photon. The current continues until the avalanche is quenched by lowering the bias voltage down to or below the breakdown voltage. This latter function is performed by a quenching circuit, which may simply comprise a high-resistance ballast load in series with the SPAD, or may alternatively comprise active circuit elements.

SUMMARY

Embodiments of the present invention that are described hereinbelow provide improved single-photon sensing arrays and methods for their operation.

There is therefore provided, in accordance with an embodiment of the invention, a sensing device, which includes an array of sensing elements. Each sensing element includes a photodiode, including a p-n junction, and a local biasing circuit, coupled to reverse-bias the p-n junction at a bias voltage greater than a breakdown voltage of the p-n junction by a margin sufficient so that a single photon incident on the p-n junction triggers an avalanche pulse output from the sensing element. A bias control circuit is coupled to set the bias voltage in different ones of the sensing elements to different, respective values that are greater than the breakdown voltage.

In some embodiments, the device includes a global bias generator, which is coupled to apply a global bias voltage to all of the sensing elements in the array, wherein the local biasing circuit in each sensing element is configured to apply an excess bias such that the bias voltage across each p-n junction is a sum of the global bias voltage and the excess bias. Typically, each sensing element includes a quenching circuit, and the photodiode, the local biasing circuit and the quenching circuit in each sensing element are coupled together in series.

In a disclosed embodiment, the local biasing circuit includes a voltage adder, which is coupled to a plurality of voltage lines, providing respective input voltages, and is configured to select and sum the input voltages in order to provide the bias voltage to the p-n junction.

In some embodiments, the bias control circuit is configured to set the bias voltage in the different ones of the sensing elements so as to equalize a sensitivity of the sensing elements to incident photons. Additionally or alternatively, the bias control circuit is configured to identify one or more of the sensing elements that have noise levels above a specified limit, and to set the bias voltage of the identified sensing elements so as to reduce the noise levels.

Further additionally or alternatively, the bias control circuit is configured to increase the bias voltage of the sensing elements in a selected region of the array so that the sensing elements in the selected region have a sensitivity to incident photons that is greater than the sensitivity of the sensing elements outside the specified region. In one embodiment, the bias control circuit is configured to modify the bias voltage of the sensing elements so as to sweep the selected region across the array.

In a disclosed embodiment, the array of the sensing elements includes a first two-dimensional matrix of the sensing elements formed on a first semiconductor chip, and the bias control circuit includes a second two-dimensional matrix of bias control elements formed on a second semiconductor chip and coupled to the first matrix in a one-to-one correspondence between the sensing elements and the bias control elements. Typically, the second semiconductor chip includes processing circuits coupled to receive respective output pulses from the sensing elements, wherein the processing circuits include a respective time-to-digital converter (TDC) coupled to each sensing element.

There is also provided, in accordance with an embodiment of the invention, a method for sensing, which includes providing an array of sensing elements, each sensing element including a photodiode, including a p-n junction, and a biasing circuit, coupled to reverse-bias the p-n junction at a bias voltage greater than a breakdown voltage of the p-n junction by a margin sufficient so that a single photon incident on the p-n junction triggers an avalanche pulse output from the sensing element. The bias voltage is set in different ones of the sensing elements to different, respective values that are greater than the breakdown voltage.

The present invention will be more fully understood from the following detailed description of the embodiments thereof, taken together with the drawings in which:

DETAILED DESCRIPTION OF EMBODIMENTS

Figure 1:
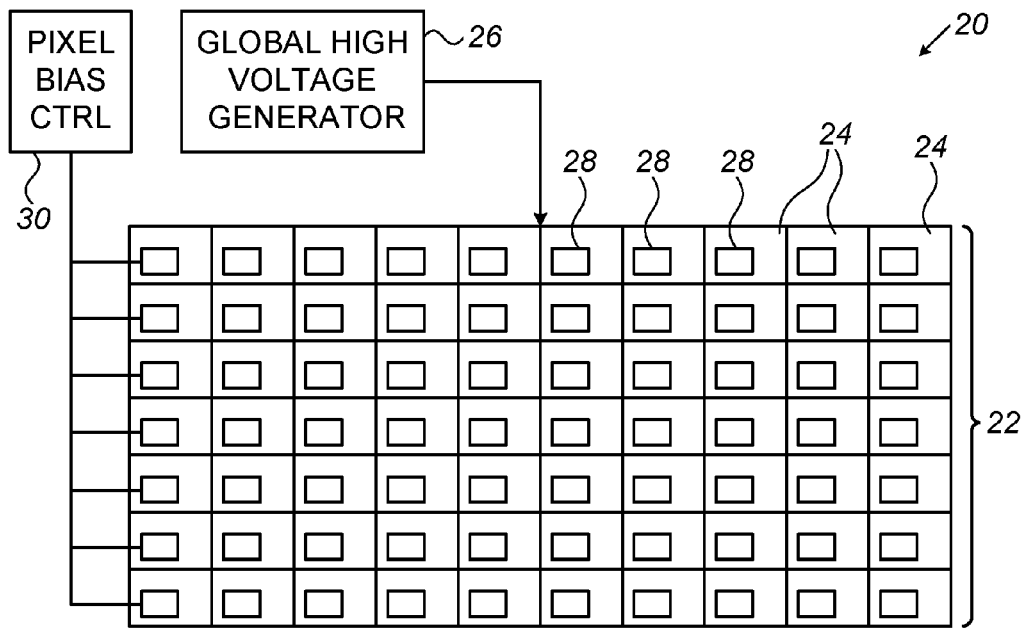
FIG. 1 is a block diagram that schematically illustrates a SPAD-based sensing device, in accordance with an embodiment of the invention.

The margin by which the bias voltage on a SPAD sensing element exceeds the breakdown voltage determines both the quantum efficiency and the dark noise of the sensing element. (Both quantum efficiency and dark noise increase with the excess bias voltage.) At the same time, the breakdown voltages of the sensing elements in a SPAD array typically vary from element to element due, for example, to local variations in geometry and dopant concentration. Therefore, when the bias is applied globally, with the same total bias voltage across each photodiode, the margin by which the bias voltage exceeds the breakdown voltage will vary from element to element, as well, resulting in variations among the sensing elements in sensitivity and noise level.

Embodiments of the present invention that are described herein address this problem by enabling the bias voltage of different sensing elements in an array to be set to different values. This feature can be exploited not only to equalize sensitivity over the array and quiet noisy pixels, but also to introduce intentional sensitivity variations for the purpose of more selectively and efficiently exploiting the detection capabilities of the array. The principles of the present invention can be applied, for example, in SPAD imaging arrays, such as those used in 3D cameras based on time-of-flight (TOF) measurement, as well as in silicon photomultiplier (SiPM) devices and other sorts of avalanche diode arrays.

In the disclosed embodiments, a sensing device comprises an array of sensing elements, each of which comprises a photodiode and a biasing circuit. The biasing circuit in each sensing element is capable of applying a reverse-bias to the p-n junction of the photodiode at a bias voltage that is greater than the junction breakdown voltage of the p-n junction by a margin sufficient so that a single photon incident on the p-n junction triggers an avalanche pulse output from the sensing element. A bias control circuit sets the bias voltages in the different sensing elements to different, respective values that are greater than the breakdown voltage.

In some embodiments, a global bias generator applies a global bias voltage to all of the sensing elements in the array, while the local biasing circuit in each sensing element applies an excess bias in addition to the global bias. Thus, the bias voltage across each p-n junction is a sum of the global bias voltage and the excess bias (wherein the excess bias may be positive or negative relative to the global bias, depending on circuit configuration). Typically, each sensing element also comprises a quenching circuit, with the photodiode, the biasing circuit and the quenching circuit in each sensing element coupled together in series.

The bias control circuit can set the different values of bias voltage in the different sensing elements to achieve a variety of purposes. For example, in one embodiment, the bias voltages are set so as to compensate for differences in breakdown voltage and thus equalize the sensitivity of the sensing elements to incident photons. Alternatively or additionally, the bias control circuit can identify one or more of the sensing elements that have noise levels above a specified limit, and can set the bias voltages of these identified sensing elements so as to reduce the noise levels, possibly to the extent of shutting off the noisy sensing elements altogether.

In other embodiments, the bias control circuit increases the bias voltage of the sensing elements in a certain, selected region of the array, so that the sensing elements in this region have a greater sensitivity to incident photons than the sensing elements outside the region. As noted earlier, this feature can be useful in more efficiently exploiting the detection capabilities of the array, for example by tailoring the sensitive region of the array to the shape of an illuminating light beam or of an area of interest in a scene being imaged. In some embodiments, the bias control circuit can modify the bias voltage of the sensing elements dynamically so as to sweep the selected region across the array.

FIG. 1 is a block diagram that schematically illustrates a sensing device 20, in accordance with an embodiment of the invention. Device 20 comprises an array 22 of sensing elements 24 (also referred to as pixels), each comprising a SPAD and associated biasing and processing circuits, as described further hereinbelow. A global high-voltage bias generator 26 applies a global bias voltage to all of sensing elements 24 in array 22. In addition, a local biasing circuit 28 in each sensing element 24 applies an excess bias, which sums with the global bias in the sensing element. A pixel bias control circuit 30 sets the excess bias voltages applied by local biasing circuits 28 to different, respective values in different sensing elements.

Figure 2:
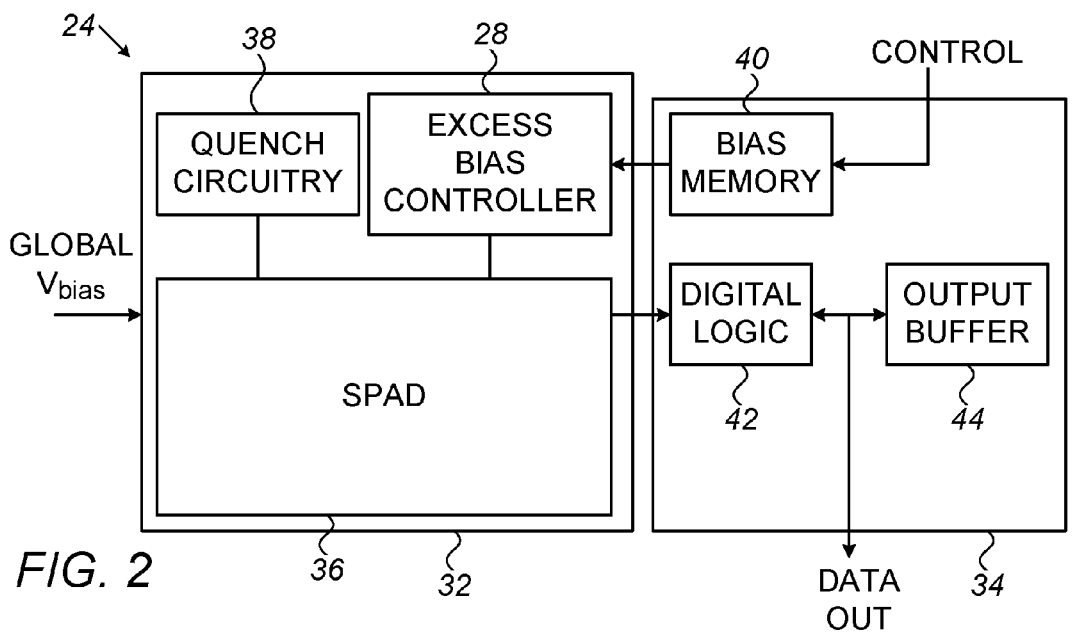
FIG. 2 is a block diagram showing components of a sensing element in a SPAD array, in accordance with an embodiment of the invention.

FIG. 2 is a block diagram showing components of one of sensing elements 24 in array 22, in accordance with an embodiment of the invention. Array 22 in this embodiment comprises a two-dimensional matrix of the sensing elements formed on a first semiconductor chip 32, with a second two-dimensional matrix of bias control and processing circuits formed on a second semiconductor chip 34. (Only a single element of each of the two matrices is shown.) Chips 32 and 34 are coupled together so that the two matrices are in a one-to-one correspondence, whereby each sensing element on chip 32 is in contact with the corresponding bias control and processing elements on chip 34.

Both of chips 32 and 34 may be produced from silicon wafers using well-known CMOS fabrication processes, based on SPAD sensor designs that are known in the art, along with accompanying bias control and processing circuits as described herein. Alternatively, the designs and principles of detection that are described herein may be implemented, mutatis mutandis, using other materials and processes. For example, all of the components shown in FIG. 2 may be formed on a single chip, or the distribution of the components between the chips may be different. All such alternative implementations are considered to be within the scope of the present invention.

Sensing element 24 comprises a SPAD 36, comprising a photosensitive p-n junction, as is known in the art. Peripheral circuits including a quenching circuit 38 and local biasing circuit 28, are typically located on chip 32 together with the SPAD. As explained above, the actual bias applied to SPAD 36 is a sum of the global $V_{bias}$ provided by bias generator 26 (FIG. 1) and an excess bias applied by biasing circuit 28. Pixel bias control circuit 30 sets the excess bias to be applied in each pixel by setting a corresponding digital value in a bias memory 40 on chip 34.

In response to each captured photon, SPAD 36 outputs an avalanche pulse, which is received by processing circuits on chip 34, including digital logic 42 and a memory configured as an output buffer 44. These processing elements can be configured, for example, to function as a time-to-digital converter (TDC), which measures the delay of each pulse output by SPAD 36 relative to a reference time and outputs a digital data value corresponding to the delay. Alternatively or additionally, logic 42 and buffer 44 may measure and output other sorts of values, including (but not limited to) a histogram of pulse delay times.

Figure 3:
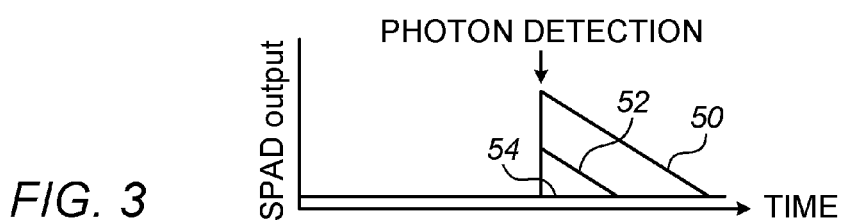
FIG. 3 is a plot that schematically illustrates responses of detectors in a SPAD array to an incident photon as a function of bias, in accordance with an embodiment of the invention.

FIG. 3 is a plot that schematically illustrates responses of SPAD 36 to an incident photon as a function of bias applied by local biasing circuit 28, in accordance with an embodiment of the invention. This figure shows three curves 50, 52, 54, representing the pulses output by SPAD 36 at three different excess bias settings of biasing circuit 28.

Curve 50 corresponds to a case in which the excess bias is set to give a total bias voltage across the p-n junction that is substantially greater than the breakdown voltage. At this setting, sensing element 24 has a high sensitivity, and the avalanche pulse output by SPAD 36 in response to the incident photon consequently has a high amplitude.

Curve 52 represents an intermediate bias setting, at which the output pulse has a lower amplitude, meaning lower sensitivity. At the same time, the dark noise at this bias setting will typically be lower than for the setting of curve 50.

Curve 54 represents a case in which the excess bias is set so that the total bias voltage is less than the breakdown voltage across the p-n junction. At this bias level, sensing element 24 is essentially turned off, but also contributes little or no dark noise to device 20. This low overall bias setting can be used to quiet noisy pixels, as well as to reduce the total power consumption of device 20 by turning off pixels that are outside a current region of interest.

In one embodiment, bias control circuit 30 takes part in a calibration procedure before device 20 is put into operation. In such a procedure, array is illuminated with a certain predefined test pattern (which may simply comprise uniform, low-level illumination), and the outputs of sensing elements 24 are evaluated. When the calibration results show variations in sensitivity among the sensing elements, bias control circuit 30 may set the individual pixel bias voltages so as to equalize the sensitivity, for example by increasing the total voltage for sensing elements that exhibit low sensitivity, and/or vice versa. Additionally or alternatively, when the bias control circuit identifies a sensing element that is particularly noisy (for example, having a dark noise level above a specified limit), it can set the excess bias voltage applied by local biasing circuit 28 in this sensing element 24 so as to reduce the noise level, including turning off the sensing element entirely, as illustrated by curve 54.

Figure 4A:
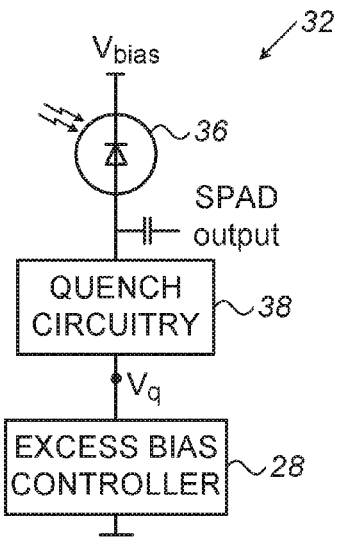
FIGS. 4A-C are electrical circuit diagrams that schematically illustrate components of a pixel in a SPAD array, in accordance with three different embodiments of the invention.
Figure 4B:
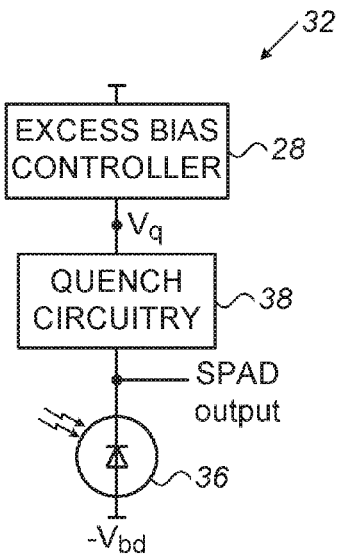
Figure 4C:
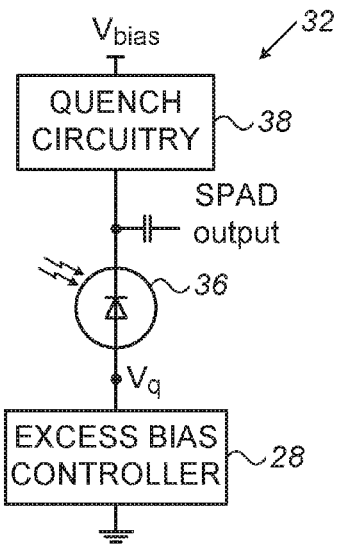

FIGS. 4A-C are electrical circuit diagrams that schematically illustrate components of a sensing element in chip 32 in array 22, in accordance with three different embodiments of the invention. In all of the embodiments, photodiode 36, local biasing circuit 28 and quenching circuit 38 are coupled together in series. The global bias voltage $V_{bias}$ (or equivalently, the negative bias $V_{bd}$ in FIG. 4B) is applied to all sensing elements 24 by global bias generator 26. Local biasing circuit 28 applies an excess bias $V_q$, which is summed with the global bias across SPAD 36. As noted earlier, the term "sum," as used in this context in the present description and in the claims, includes both positive- and negative-polarity summation. Thus, the actual bias across SPAD 36 in FIGS. 4A and 4C is $V_{bias}-V_q$; and increasing $V_q$ by circuit 28 in these embodiments results in lower net bias on the SPAD. Quenching circuit 38 may likewise be coupled to either the anode or the cathode of SPAD 36, and the pulse output from the SPAD may be AC-coupled (as in FIGS. 4A and 4C) or DC-coupled (as in FIG. 4B).

Figure 5:
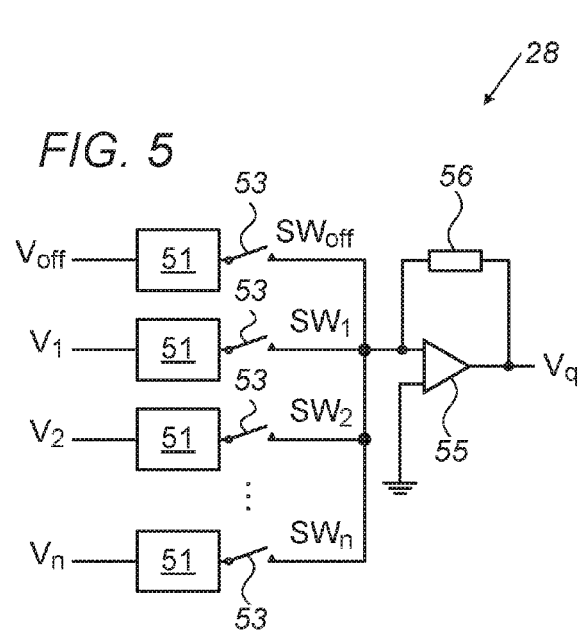
FIG. 5 is an electrical circuit diagram that schematically illustrates a local bias controller, in accordance with an embodiment of the invention.

FIG. 5 is an electrical circuit diagram that schematically shows details of local biasing circuit 28, in accordance with an embodiment of the invention. In this example implementation, local biasing circuit comprises a voltage adder, which is coupled to multiple voltage lines, providing respective input voltages: $V_{off}$ (i.e., a baseline voltage), $V_1, V_2, \ldots V_n$, via respective input resistors 51. Switches 53 are set to open or closed positions in order to select the input voltages to be summed in order to give the desired excess bias, while an operational amplifier 55 with feedback resistance 56 sums the input voltages in order to provide the bias voltage $V_q$ to SPAD 36.

This implementation is advantageous in that it enables pixel bias control circuit 30 to select the bias to be applied by each sensing element 24 from a relatively large range of values while minimizing the number of voltage lines that must actually be supplied to array 22. The settings of switches 53 are typically stored in bias memory 40, and read out in order to set the switches in each frame. The switch settings may be pre-calibrated, as explained above, or they may, alternatively or additionally, be modified dynamically during the operation of device 20, as described below. Alternatively, local biasing circuit may comprise other sorts of voltage control mechanisms, as are known in the art.

Figure 6:
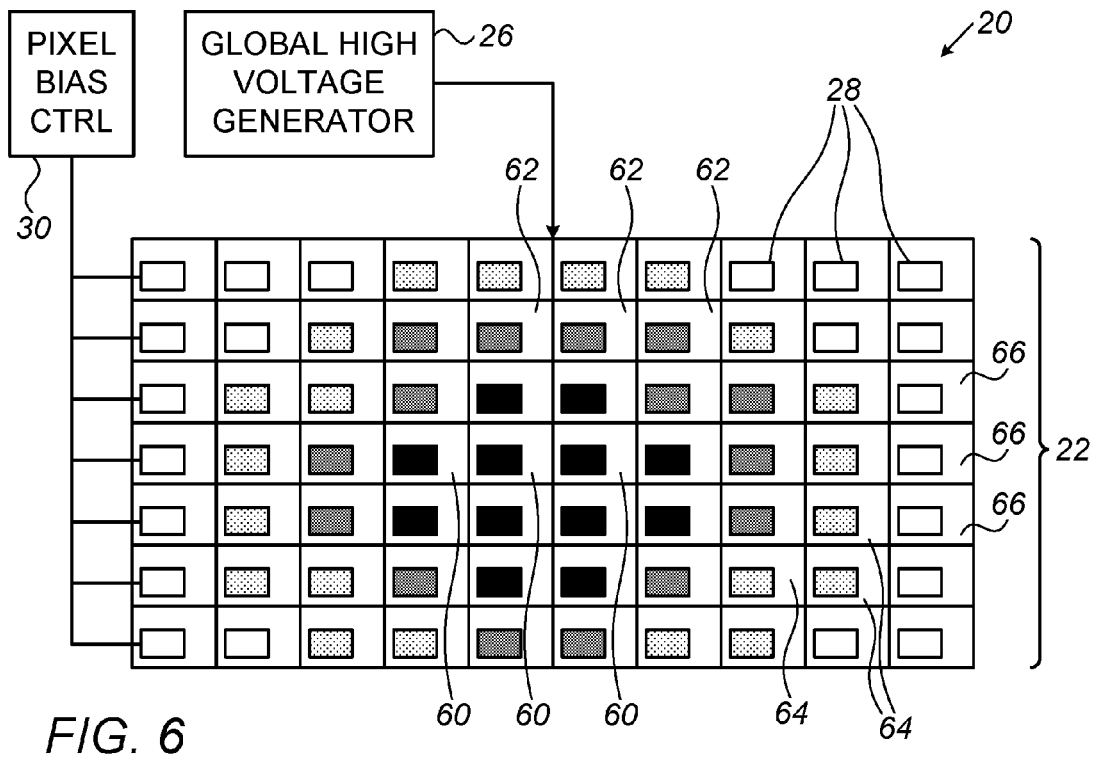
FIG. 6 is a block diagram that schematically illustrates a SPAD array with variable sensitivity, in accordance with an embodiment of the invention.

FIG. 6 is a block diagram that schematically illustrates a configuration of device 20 with sensitivity that varies among the sensing elements in array 22, in accordance with an embodiment of the invention. In this embodiment, bias control circuit 30 sets the excess bias voltages applied by local biasing circuits 28 so that the net bias voltage, and hence the sensitivity, of the sensing elements is higher in a certain region of the array than outside the region. Specifically, the bias voltage and sensitivity are greatest in pixels 60, lower in surrounding pixels 62, and still lower in peripheral pixels 64. The bias in pixels 66 outside the selected region is set so that these pixels are turned off. Although the selected region in this case is a roughly circular area in the center of array 22, any region, of any suitable shape, may be chosen in this fashion.

As noted earlier, this embodiment is useful, inter alia, in tailoring the sensitive region of array 22 to the shape of an illuminating light beam or of an area of interest in a scene being imaged. In silicon photomultiplier (SiPM) applications, for example, in which the outputs of sensing elements 24 are connected together, the configuration of FIG. 6 is particularly helpful in maximizing sensitivity of device 20 relative to power consumption, while reducing background noise from pixels that will not contribute to the signal.

Figure 7:
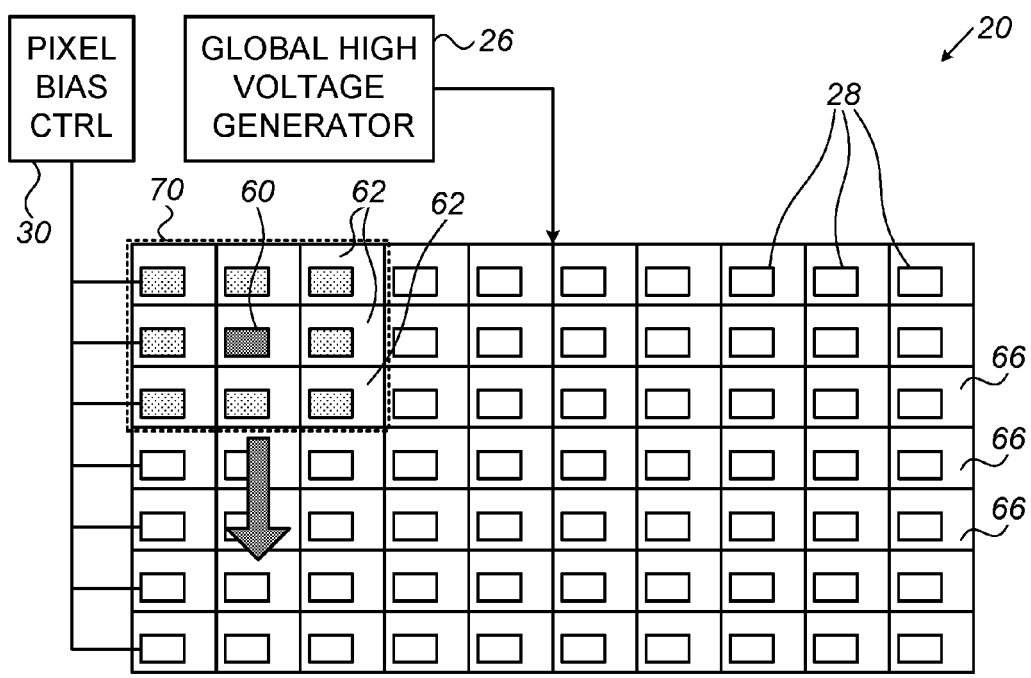
FIG. 7 is a block diagram that schematically illustrates a SPAD array with a scanned region of sensitivity, in accordance with an embodiment of the invention.

FIG. 7 is a block diagram that schematically illustrates SPAD array 22 with a scanned region 70 of sensitivity, in accordance with an embodiment of the invention. In this case, bias control circuit 30 sets the bias voltages of pixels 60 and 62 within region 70 to higher values than the remaining pixels in array 22. Bias control circuit 30 modifies the bias voltages of sensing elements 24 dynamically, however, so as to sweep region 70 across the array, as illustrated by the arrow in the figure. Circuit 30 may, for example, sweep region 70 in a raster scan, in synchronization with the scanning of a laser beam across a scene being imaged onto array 22.

In an alternative embodiment (not shown in the figures), bias control circuit 30 sets the local bias voltages so that region 70 has a linear shape, extending along one or more columns of array 22 and matching the linear shape of an illumination beam. Circuit 30 may then sweep this linear region 70 across array 22 in synchronization with the illumination beam. Alternatively, other scan patterns may be implemented, including both regular and adaptive scan patterns.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A sensing device, comprising:
a global bias generator, which is configured to generate a global bias voltage;
an array of sensing elements, each sensing element coupled to receive the global bias voltage and comprising:
a photodiode, comprising a p-n junction; and
a local biasing circuit, coupled in series with the photodiode and the global bias voltage and configured to apply an excess bias voltage across the p-n junction so as to reverse-bias the p-n junction at a total bias voltage that is a sum of the global bias voltage and the excess bias voltage and is greater than a breakdown voltage of the p-n junction by a margin sufficient so that a single photon incident on the p-n junction triggers an avalanche pulse output from the sensing element; and
a bias control circuit, which is coupled to set the excess bias voltage in different ones of the sensing elements to different, respective values.

2. The device according to claim 1, wherein each sensing element comprises a quenching circuit, and wherein the photodiode, the local biasing circuit and the quenching circuit in each sensing element are coupled together in series.

3. The device according to claim 1, wherein the local biasing circuit comprises a voltage adder, which is coupled to a plurality of voltage lines, providing respective input voltages, and is configured to select and sum the input voltages in order to set the excess bias voltage that is applied to the p-n junction.

4. The device according to claim 1, wherein the bias control circuit is configured to set the excess bias voltage in the different ones of the sensing elements so as to equalize a sensitivity of the sensing elements to incident photons.

5. The device according to claim 1, wherein the bias control circuit is configured to identify one or more of the sensing elements that have noise levels above a specified limit, and to set the excess bias voltage of the identified sensing elements so as to reduce the noise levels.

6. The device according to claim 1, wherein the bias control circuit is configured to increase the total bias voltage of the sensing elements in a selected region of the array so that the sensing elements in the selected region have a sensitivity to incident photons that is greater than the sensitivity of the sensing elements outside the specified region.

7. The device according to claim 6, wherein the bias control circuit is configured to modify the excess bias voltage of the sensing elements so as to sweep the selected region across the array.

8. The device according to claim 1, wherein the array of the sensing elements comprises a first two-dimensional matrix of the sensing elements formed on a first semiconductor chip, and wherein the bias control circuit comprises a second two-dimensional matrix of bias control elements formed on a second semiconductor chip and coupled to the first two-dimensional matrix in a one-to-one correspondence between the sensing elements and the bias control elements.

9. The device according to claim 8, wherein the second semiconductor chip comprises processing circuits coupled to receive respective output pulses from the sensing elements, wherein the processing circuits comprise a respective time-to-digital converter (TDC) coupled to each sensing element.

10. A method for sensing, comprising:
generating a global bias voltage;
providing an array of sensing elements, each sensing element coupled to receive the global bias voltage and comprising a photodiode, comprising a p-n junction, and a local biasing circuit, coupled in series with the photodiode and the global bias voltage and configured to apply an excess bias voltage across the p-n junction so as to reverse-bias the p-n junction at a total bias voltage that is a sum of the global bias voltage and the excess bias voltage and is greater than a breakdown voltage of the p-n junction by a margin sufficient so that a single photon incident on the p-n junction triggers an avalanche pulse output from the sensing element; and
setting the excess bias voltage in different ones of the sensing elements to different, respective values.

11. The method according to claim 10, wherein each sensing element comprises a quenching circuit, and wherein providing the array comprises coupling the photodiode, the local biasing circuit and the quenching circuit in each sensing element together in series.

12. The method according to claim 10, wherein the local biasing circuit comprises a voltage adder, which is coupled to a plurality of voltage lines, providing respective input voltages, and wherein setting the excess bias voltage comprises selecting and summing the input voltages in order to provide the excess bias voltage to the p-n junction.

13. The method according to claim 10, wherein the excess bias voltage in the different ones of the sensing elements is set so as to equalize a sensitivity of the sensing elements to incident photons.

14. The method according to claim 10, wherein setting the excess bias voltage comprises identifying one or more of the sensing elements that have noise levels above a specified limit, and setting the excess bias voltage of the identified sensing elements so as to reduce the noise levels.

15. The method according to claim 10, wherein setting the excess bias voltage comprises increasing the total bias voltage of the sensing elements in a selected region of the array so that the sensing elements in the selected region have a sensitivity to incident photons that is greater than the sensitivity of the sensing elements outside the specified region.

16. The method according to claim 15, wherein increasing the total bias voltage comprises modifying the excess bias voltage of the sensing elements so as to sweep the selected region across the array.

17. The method according to claim 10, wherein providing the array of the sensing elements comprises providing a first two-dimensional matrix of the sensing elements formed on a first semiconductor chip, and providing a second two-dimensional matrix of bias control elements formed on a second semiconductor chip and coupled to the first two-dimensional matrix in a one-to-one correspondence between the sensing elements and the bias control elements.

18. The method according to claim 17, wherein the second semiconductor chip comprises processing circuits coupled to receive respective output pulses from the sensing elements, wherein the processing circuits comprise a respective time-to-digital converter (TDC) coupled to each sensing element.

\* \* \* \* \*